United States Patent
Okuni et al.

(10) Patent No.: US 9,312,236 B2
(45) Date of Patent: Apr. 12, 2016

(54) SEMICONDUCTOR DEVICE, WIRELESS DEVICE, AND STORAGE DEVICE

(71) Applicant: KABUSHIKI KAISHA TOSHIBA, Minato-ku, Tokyo (JP)

(72) Inventors: Hidenori Okuni, Yokohama (JP); Yukako Tsutsumi, Kawasaki (JP); Koji Akita, Yokohama (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 165 days.

(21) Appl. No.: 14/185,778

(22) Filed: Feb. 20, 2014

(65) Prior Publication Data

US 2014/0246778 A1    Sep. 4, 2014

(30) Foreign Application Priority Data

Mar. 1, 2013  (JP) ................................. 2013-040966

(51) Int. Cl.
*H01L 23/48* (2006.01)
*H01L 23/00* (2006.01)
*H01L 23/50* (2006.01)
(Continued)

(52) U.S. Cl.
CPC .............. *H01L 24/49* (2013.01); *H01L 23/50* (2013.01); *H01L 23/5386* (2013.01); *H01L 24/06* (2013.01); *H01L 25/16* (2013.01); *H01Q 1/2283* (2013.01); *H01Q 23/00* (2013.01); *H01L 24/05* (2013.01); *H01L 24/48* (2013.01); *H01L 25/18* (2013.01); *H01L 2224/05553* (2013.01); *H01L 2224/48137* (2013.01); *H01L 2224/48227* (2013.01); *H01L 2224/49109* (2013.01); *H01L 2224/49175* (2013.01);
(Continued)

(58) Field of Classification Search
CPC ......... H01L 24/49; H01L 24/48; H01L 24/06; H01L 23/5386; H01L 23/50
See application file for complete search history.

(56) References Cited

U.S. PATENT DOCUMENTS 5,627,792 A  *  5/1997  Tsujimoto .............. G11C 5/025
                                                  365/230.03
8,648,455 B2 *  2/2014  Takeshima ............ H01L 21/565
                                                        257/618
(Continued)

FOREIGN PATENT DOCUMENTS

JP          08125143  A     5/1996
JP          09252081  A     9/1997
(Continued)

OTHER PUBLICATIONS

U.S. Appl. No. 14/092,509, filed Nov. 27, 2013, Title: "Semiconductor Apparatus", First Named Inventor: Yukako Tsutsumi.

*Primary Examiner* — Nicholas Tobergte
(74) *Attorney, Agent, or Firm* — Holtz, Holtz & Volek PC

(57) ABSTRACT

According to one embodiment, a semiconductor device includes a substrate, a first semiconductor chip, a second semiconductor chip, and a discrete element part. The first semiconductor chip is arranged on the substrate and includes a first electrode group. The second semiconductor chip is arranged on the substrate and includes a second electrode group, at least one of electrodes included in the second electrode group being connected to at least one of electrodes included in the first electrode group via at least one bonding wire. The discrete element part is arranged on the substrate and under the at least one bonding wire.

20 Claims, 12 Drawing Sheets

| | Electrode | | | | | |
|---|---|---|---|---|---|---|
| | 111-4 | 121-4 | 111-1 | 111-7 | 121-1 | 121-7 |
| Example 1 | Power supply interconnection 1 | Power supply interconnection 2 | Ground interconnection 3 | Ground interconnection 4 | Ground interconnection 5 | Ground interconnection 6 |
| Example 2 | Ground interconnection 1 | Ground interconnection 2 | Power supply interconnection 3 | Power supply interconnection 4 | Power supply interconnection 5 | Power supply interconnection 6 |
| Example 3 | Power supply interconnection 1 | Power supply interconnection 2 | Common ground interconnection | Common ground interconnection | Common ground interconnection | Common ground interconnection |
| Example 4 | Common power supply interconnection | Common power supply interconnection | Common ground interconnection | Common ground interconnection | Common ground interconnection | Common ground interconnection |

(51) Int. Cl.
*H01L 25/16* (2006.01)
*H01L 23/538* (2006.01)
*H01Q 1/22* (2006.01)
*H01Q 23/00* (2006.01)
*H01L 25/18* (2006.01)

(52) U.S. Cl.
CPC ............... *H01L 2924/00014* (2013.01); *H01L 2924/19105* (2013.01); *H01L 2924/3011* (2013.01)

(56) References Cited

U.S. PATENT DOCUMENTS

| | | |
|---|---|---|
| 2004/0145042 A1 | 7/2004 | Morita et al. |
| 2005/0212853 A1 | 9/2005 | Eguchi et al. |
| 2006/0012022 A1* | 1/2006 | Ararao et al. ........ H01L 23/3128 257/689 |
| 2006/0244130 A1* | 11/2006 | Yeh ....................... H01L 21/485 257/723 |
| 2007/0052079 A1 | 3/2007 | Tsai et al. |
| 2008/0211110 A1 | 9/2008 | Otsuka et al. |
| 2011/0012250 A1 | 1/2011 | Matsumura |
| 2011/0109000 A1 | 5/2011 | Kim et al. |
| 2012/0223343 A1* | 9/2012 | Kang ....................... H01L 33/62 257/88 |
| 2012/0273971 A1* | 11/2012 | Usami .................... H01L 21/561 257/777 |
| 2013/0245619 A1* | 9/2013 | Yasunaga ............. A61B 18/085 606/31 |

FOREIGN PATENT DOCUMENTS

| | | |
|---|---|---|
| JP | 2002343930 A | 11/2002 |
| JP | 2004221215 A | 8/2004 |
| JP | 2006073625 A | 3/2006 |
| JP | 2008211188 A | 9/2008 |
| JP | 2009054850 A | 3/2009 |
| JP | WO2008084841 A1 | 5/2010 |
| JP | 2011155208 A | 8/2011 |
| JP | 2012-080145 A | 4/2012 |
| JP | 4940064 B2 | 5/2012 |

* cited by examiner

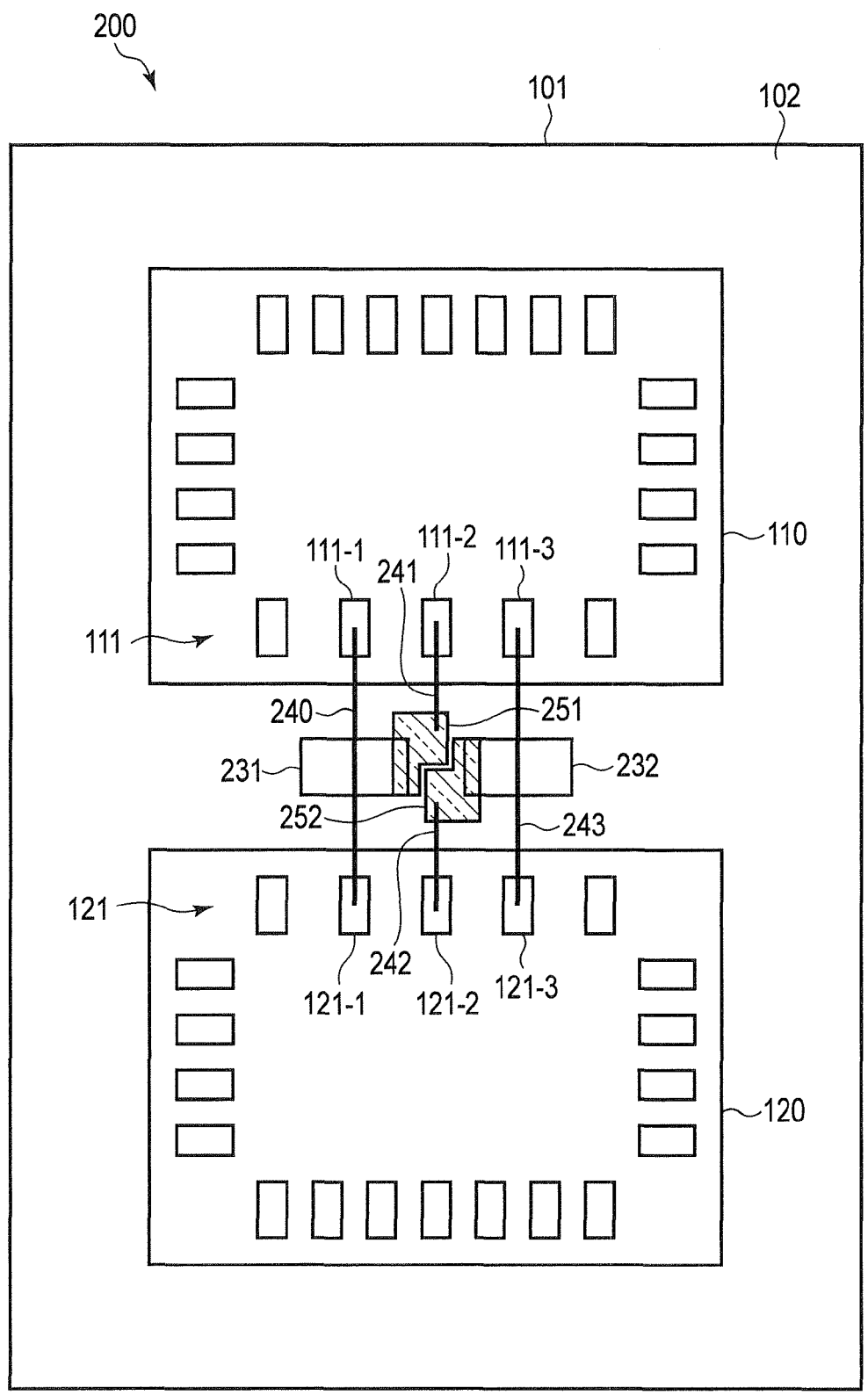
F I G. 2

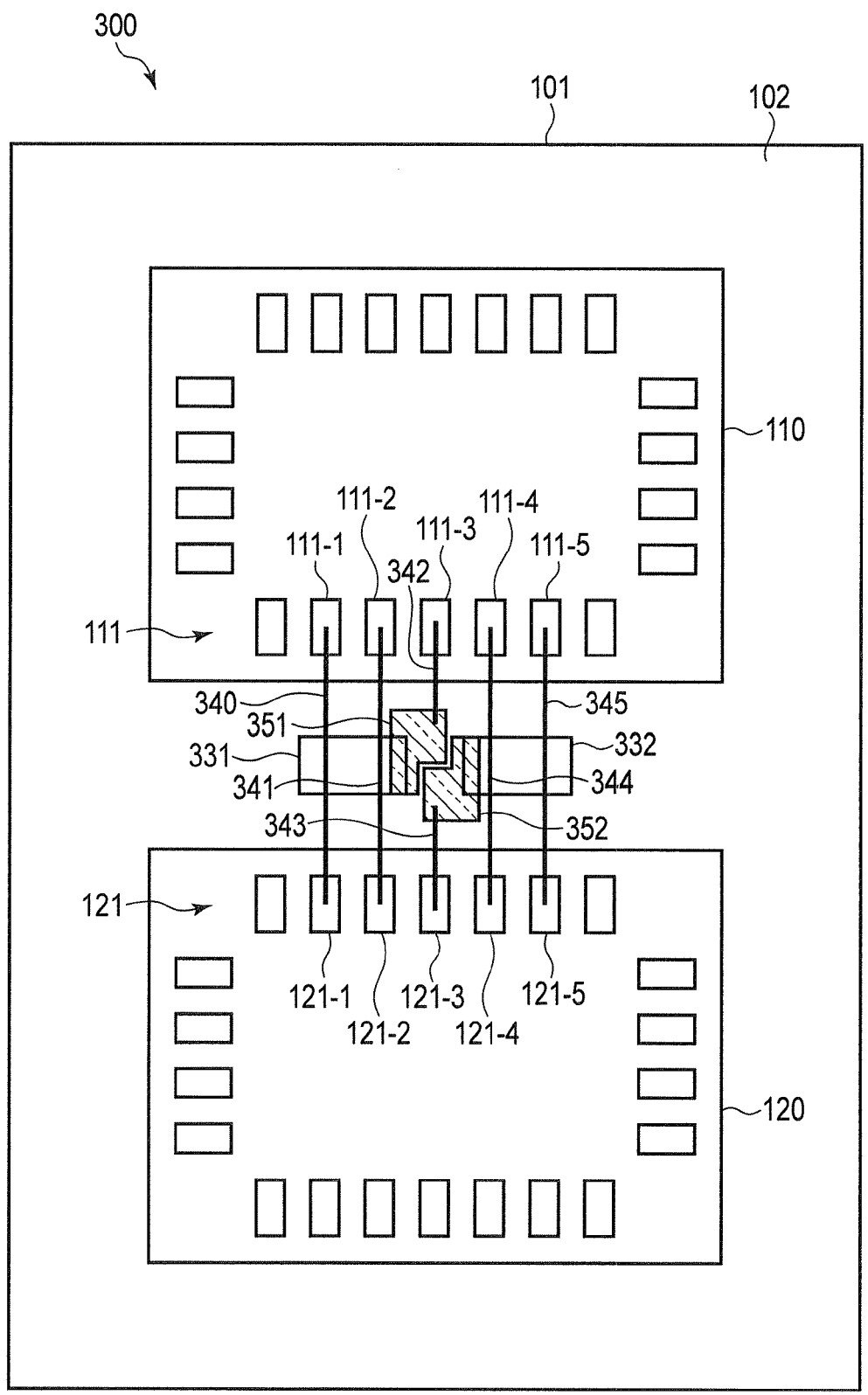
F I G. 3

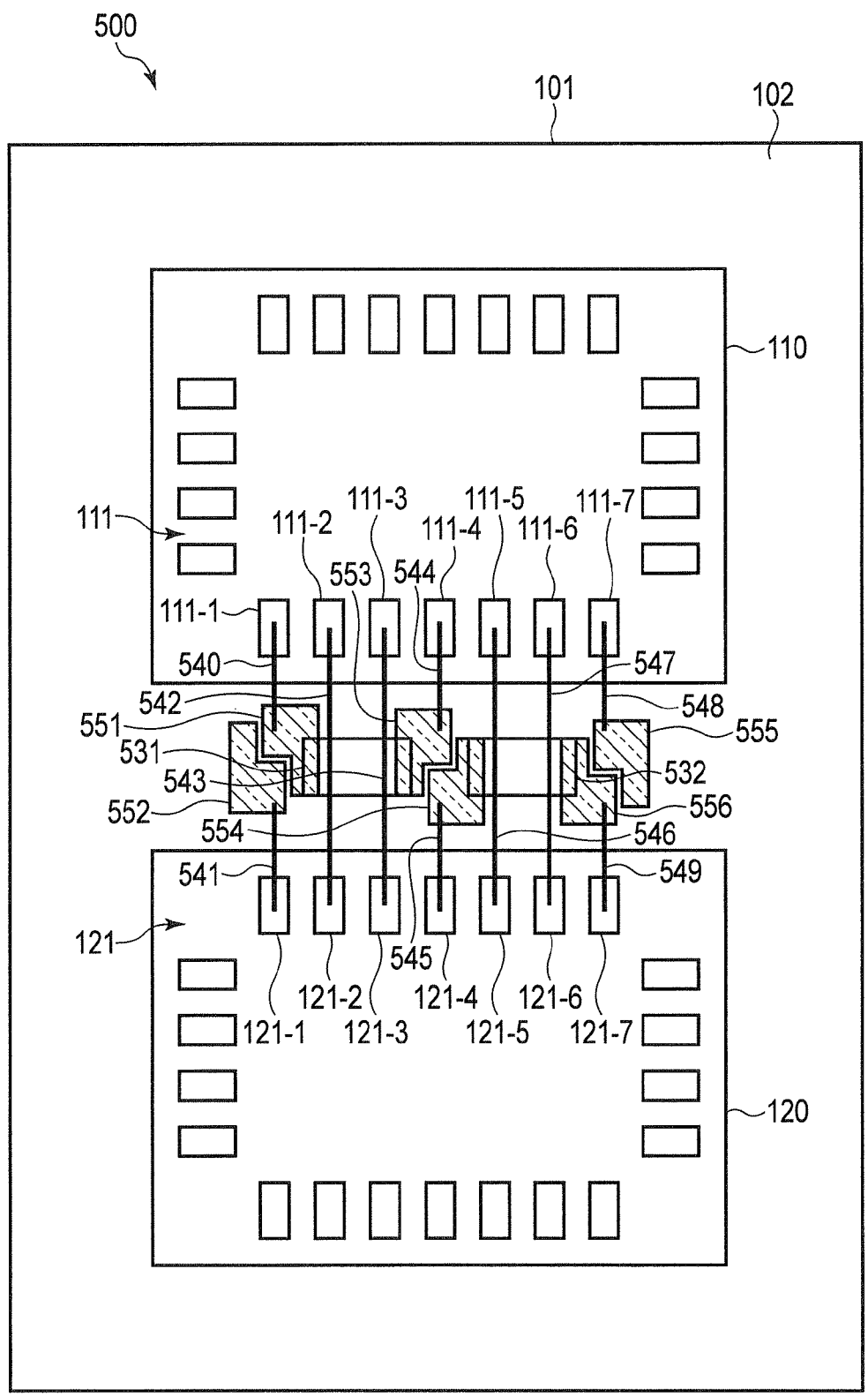
F I G. 5

| | Electrode | | | | | | |
|---|---|---|---|---|---|---|---|
| | 111-4 | 121-4 | 111-1 | 111-7 | 121-1 | 121-7 |
| Example 1 | Power supply interconnection 1 | Power supply interconnection 2 | Ground interconnection 3 | Ground interconnection 4 | Ground interconnection 5 | Ground interconnection 6 |
| Example 2 | Ground interconnection 1 | Ground interconnection 2 | Power supply interconnection 3 | Power supply interconnection 4 | Power supply interconnection 5 | Power supply interconnection 6 |
| Example 3 | Power supply interconnection 1 | Power supply interconnection 2 | Common ground interconnection | Common ground interconnection | Common ground interconnection | Common ground interconnection |
| Example 4 | Common power supply interconnection | Common power supply interconnection | Common ground interconnection | Common ground interconnection | Common ground interconnection | Common ground interconnection |

F I G. 7

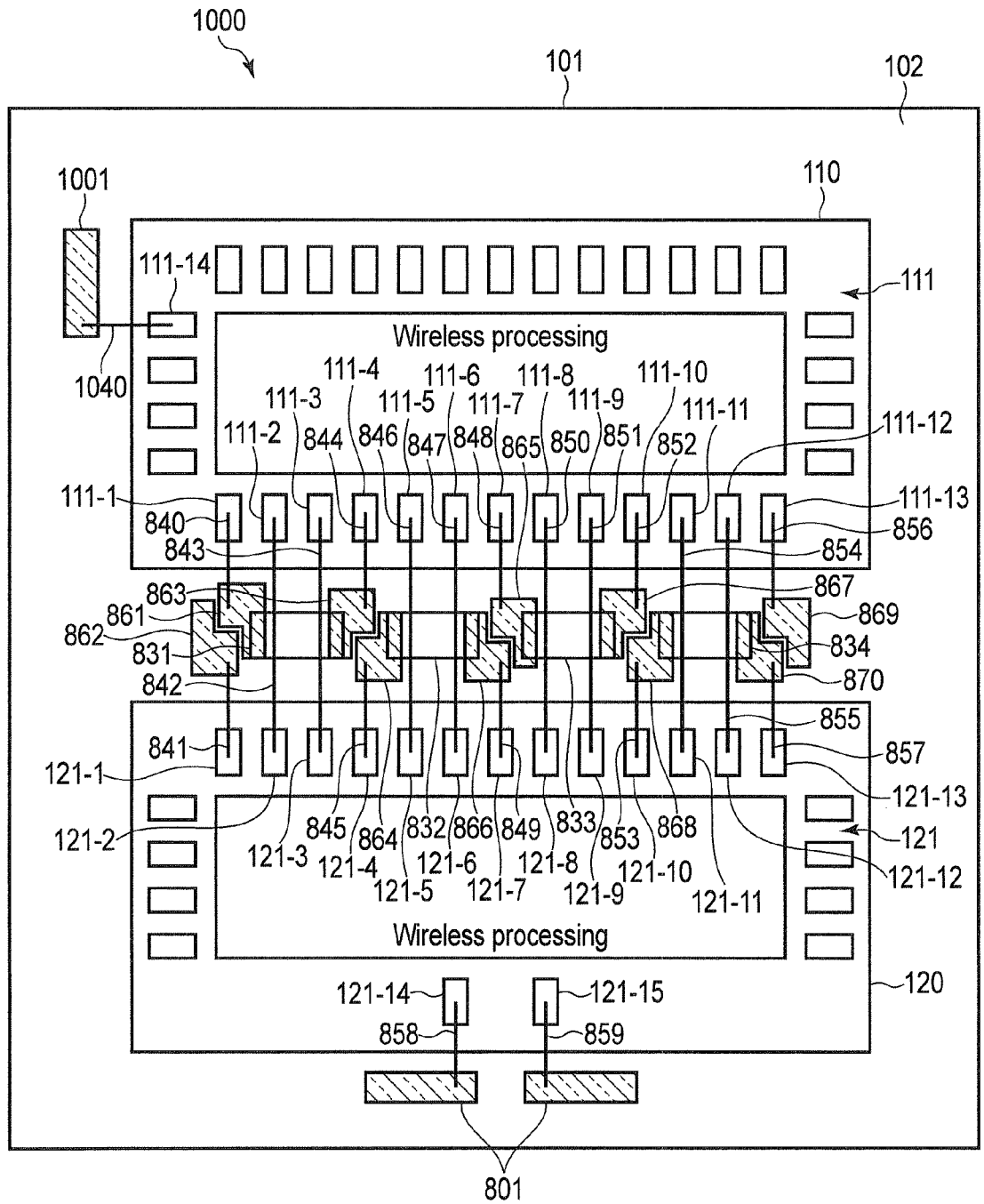
F I G. 10

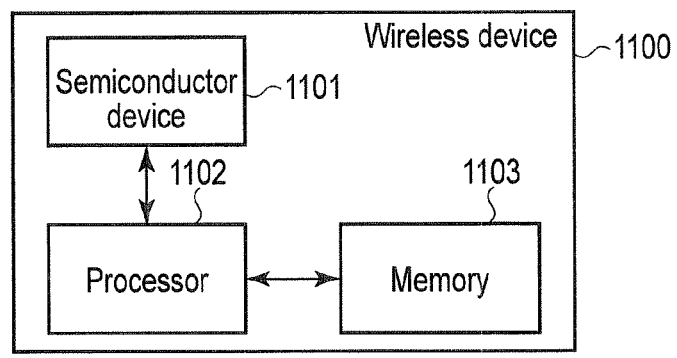
F I G. 11
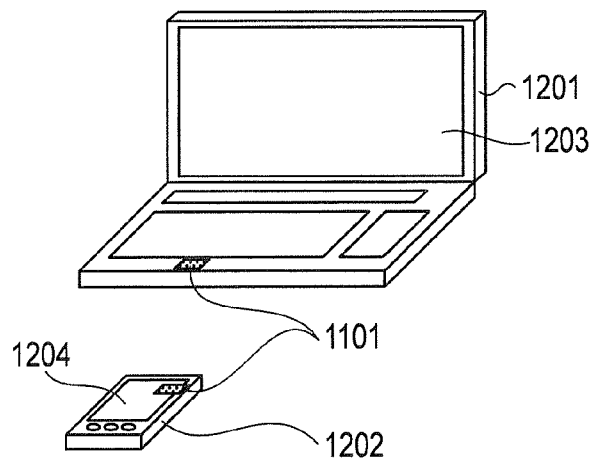
F I G. 12
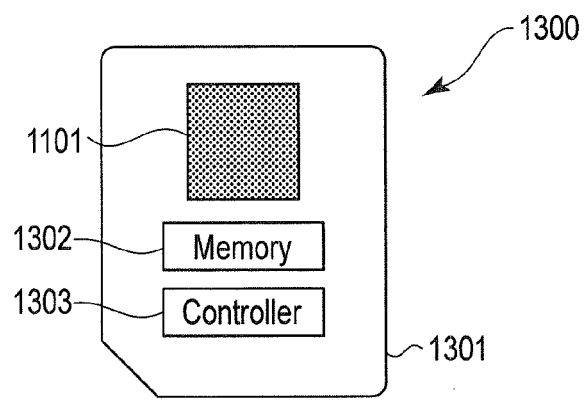
F I G. 13

US 9,312,236 B2

SEMICONDUCTOR DEVICE, WIRELESS DEVICE, AND STORAGE DEVICE

CROSS-REFERENCE TO RELATED APPLICATIONS

This application is based upon and claims the benefit of priority from Japanese Patent Application No. 2013-040966, filed Mar. 1, 2013, the entire contents of which are incorporated herein by reference.

FIELD

Embodiments described herein relate generally to a semiconductor device, and a wireless device and a storage device each including the semiconductor device.

BACKGROUND

A semiconductor device is known in which a semiconductor chip and electronic elements (for example, capacitors) are mounted on a substrate. In such a semiconductor device, a spacer is provided between the semiconductor chip and the substrate, and the electronic elements are arranged in the spacer portion, thereby implementing a high degree of integration. However, since the device height increases due to the spacer, the packaging volume increases.

A semiconductor device is required to be small in packaging volume and adapted for a high degree of integration.

BRIEF DESCRIPTION OF THE DRAWINGS

FIG. 2 is a plan view schematically showing a semiconductor device according to the second embodiment;
FIG. 3 is a plan view schematically showing a semiconductor device according to the third embodiment;
FIG. 5 is a plan view schematically showing a semiconductor device according to the fifth embodiment;
FIG. 7 is a view showing examples of connection between electrodes and interconnections on a substrate shown in FIG. 5;
FIG. 10 is a plan view schematically showing a semiconductor device according to the seventh embodiment;
FIG. 11 is a block diagram schematically showing a wireless device including a semiconductor device according to an embodiment;
FIG. 12 is a perspective view showing an example of the wireless device including the semiconductor device according to an embodiment;
and
FIG. 13 is a block diagram showing an example of a memory card including a semiconductor device according to an embodiment.

DETAILED DESCRIPTION

According to one embodiment, a semiconductor device includes a substrate, a first semiconductor chip, a second semiconductor chip, and a discrete element part. The first semiconductor chip is arranged on the substrate and includes a first electrode group. The second semiconductor chip is arranged on the substrate and includes a second electrode group, at least one of electrodes included in the second electrode group being connected to at least one of electrodes included in the first electrode group via at least one bonding wire. The discrete element part is arranged on the substrate and under the at least one bonding wire.

Various embodiments will hereinafter be described with reference to the accompanying drawings.

First Embodiment

Figure 1A:
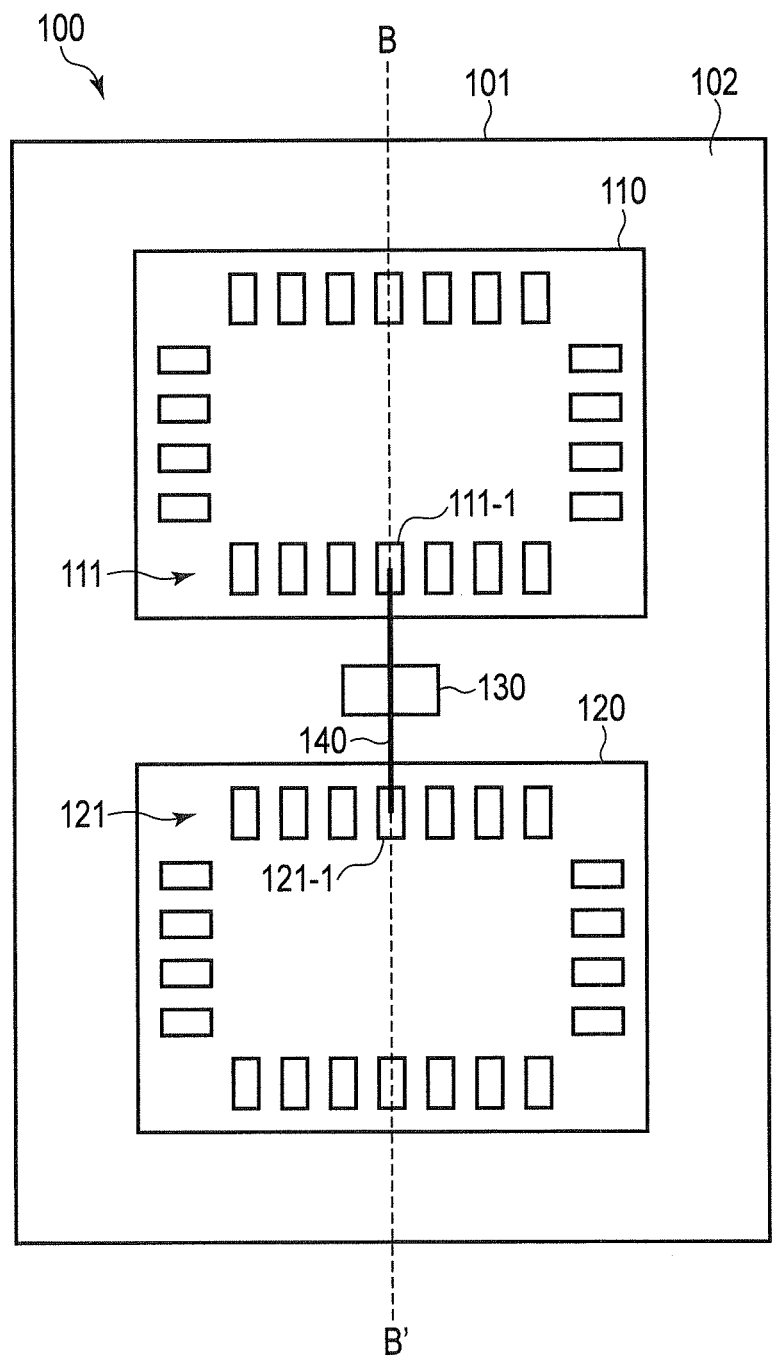
FIG. 1A is a plan view schematically showing a semiconductor device according to the first embodiment.
Figure 1B:
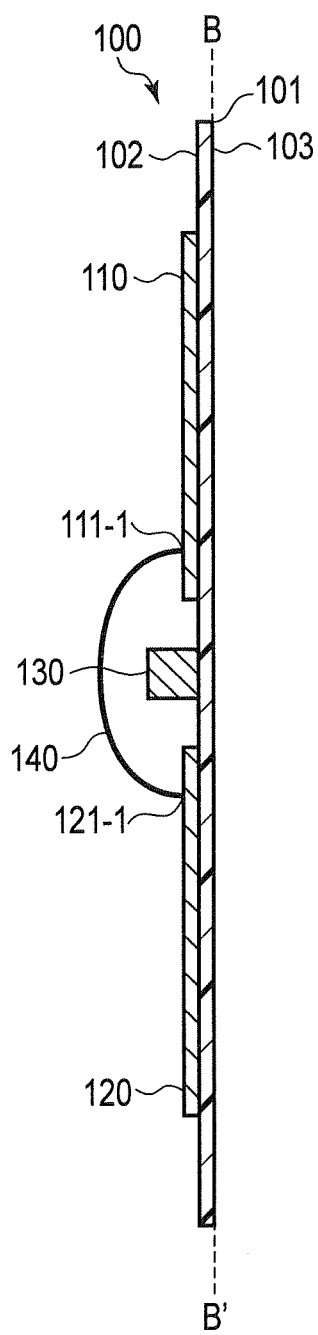
FIG. 1B is a sectional view of the semiconductor device taken along a line B-B' shown in FIG. 1A.

FIG. 1A is a plan view schematically showing a semiconductor device 100 according to the first embodiment. FIG. 1B is a sectional view of the semiconductor device 100 taken along a line B-B' shown in FIG. 1A. As shown in FIG. 1A, the semiconductor device 100 includes a substrate 101, a semiconductor chip 110 including an electrode group 111, a semiconductor chip 120 including an electrode group 121, and a discrete element part 130. The discrete element part 130 includes one or more electronic elements such as a capacitor, a resistor, and a coil.

Each of the semiconductor chips 110 and 120 includes, for example, a metal pattern formed in or on a semiconductor substrate made of a semiconductor material. As the semiconductor material, for example, silicon, silicon germanium, gallium arsenide, or the like is used. The metal pattern is made of, for example, copper, aluminum, gold, or the like. Note that each of the semiconductor chips 110 and 120 is not limited to the above-described example, and can be a chip of any form. For example, a dielectric substrate or a magnetic substrate may be used in place of the semiconductor substrate.

In the present embodiment, each of the semiconductor chips 110 and 120 has a rectangular planar shape. The electrode group 111 is provided on the surface of the semiconductor chip 110. More specifically, a plurality of electrodes are formed on the surface of the semiconductor chip 110 along its periphery. The electrode group 121 is provided on the surface of the semiconductor chip 120. More specifically, a plurality of electrodes are formed on the surface of the semiconductor chip 120 along its periphery. The electrode group 111 includes an electrode 111-1, and the electrode group 121 includes an electrode 121-1 facing the electrode 111-1.

Note that each of the semiconductor chips 110 and 120 need not always have the rectangular planar shape as in FIG. 1A, and may have a quadrilateral shape such as a square shape, a polygonal shape, a circular shape, or another complex shape. In addition, the substrate 101 need not always have the rectangular planar shape as in FIG. 1A, and can have any shape.

The semiconductor chip 110, the semiconductor chip 120, and the discrete element part 130 are arranged on the substrate 101. More specifically, the substrate 101 includes two major surfaces 102 and 103 facing each other, as shown in FIG. 1B. The semiconductor chip 110, the semiconductor chip 120, and the discrete element part 130 are arranged at different positions on the major surface 102. The discrete element part 130 is located between the semiconductor chip 110 and the semiconductor chip 120. The vertical direction will be defined here along the height direction of the semiconductor device 100 (that is, in a direction perpendicular to the major surface 102) while setting the major surface 102 on the upper side and the major surface 103 on the lower side. In this case, the major surface 102 corresponds to the upper surface, and the major surface 103 corresponds to the lower surface. In the present embodiment, since the semiconductor chip 110, the semiconductor chip 120, and the discrete element part 130 are arranged alongside on the substrate 101, the height of the semiconductor device 100 is small, that is, the packaging volume (size) of the semiconductor device 100 is small.

The semiconductor chip 110 and the semiconductor chip 120 are electrically connected by a bonding wire 140. More specifically, one end of the bonding wire 140 is connected to the electrode 111-1 of the semiconductor chip 110, and the other end of the bonding wire 140 is connected to the electrode 121-1 of the semiconductor chip 120. The discrete element part 130 is arranged under the bonding wire 140. That is, the bonding wire 140 is disposed over the discrete element part 130 so as not to come into direct or electrical contact with the discrete element part 130. In the present embodiment, the discrete element part 130 is arranged under the bonding wire 140. This makes it possible to arrange the discrete element part 130 between the semiconductor chip 110 and the semiconductor chip 120 and increase the degree of integration.

Note that the semiconductor chip 110 and the semiconductor chip 120 may electrically be connected by a plurality of bonding wires, as will be described later. The number of semiconductor chips is not limited to two, as shown in FIG. 1A, and may be three or more.

For example, the semiconductor device 100 is provided as a semiconductor package. More specifically, a sealing resin (not shown) is formed on the major surface 102 of the substrate 101. The sealing resin seals the semiconductor chips 110 and 120, the discrete element part 130, and the bonding wire 140. A plurality of terminals (not shown) are provided on the major surface 103 of the substrate 101. These terminals are formed from, for example, solder balls. These terminals are electrically connected to the semiconductor chips 110 and 120 and the discrete element part 130 via interconnections (not shown) formed on the substrate 101.

As described above, in the semiconductor device 100 according to the first embodiment, the discrete element part 130 is arranged under the bonding wire 140 that connects the semiconductor chips 110 and 120, thereby implementing a small packaging volume and a high degree of integration.

Second Embodiment

FIG. 2 is a plan view schematically showing a semiconductor device 200 according to the second embodiment. The same reference numerals as in FIG. 1A denote the same parts and portions in FIG. 2, and a description thereof will be omitted.

The semiconductor device 200 shown in FIG. 2 includes a substrate 101, a semiconductor chip 110 including an electrode group 111, a semiconductor chip 120 including an electrode group 121, and capacitors 231 and 232 corresponding to the discrete element part. The semiconductor chips 110 and 120 and the capacitors 231 and 232 are arranged at different positions on a major surface 102 of the substrate 101. The capacitors 231 and 232 are located between the semiconductor chip 110 and the semiconductor chip 120. Each of the capacitors 231 and 232 is, for example, a decoupling capacitor configured to reduce the fluctuation (noise) of the potential difference between the ground and the power supply of the semiconductor chip.

The electrode group 111 of the semiconductor chip 110 includes electrodes 111-1, 111-2, and 111-3. The electrodes 111-1 to 111-3 are arranged in this order and provided on the surface of the semiconductor chip 110 at a portion facing the semiconductor chip 120. The electrode group 121 of the semiconductor chip 120 includes electrodes 121-1, 121-2, and 121-3. The electrodes 121-1 to 121-3 are arranged in this order and provided on the surface of the semiconductor chip 120 at a portion facing the semiconductor chip 110. The electrodes 111-1 to 111-3 face the electrodes 121-1 to 121-3, respectively. The electrode 111-1 and the electrode 121-1 are electrically connected by a bonding wire 240. The electrode 111-3 and the electrode 121-3 are electrically connected by a bonding wire 243. The bonding wires 240 and 243 are signal interconnections used for signal transfer between the semiconductor chip 110 and the semiconductor chip 120. The bonding wires that electrically connect the semiconductor chips 110 and 120 will also be referred to as signal interconnections hereinafter. The capacitor 231 is arranged under the bonding wire 240, and the capacitor 232 is arranged under the bonding wire 243. The capacitors 231 and 232 are arranged under the bonding wires 240 and 243, thereby implementing a high degree of integration.

Interconnections 251 and 252 are formed on the substrate 101. The interconnections 251 and 252 are power supply interconnections for supplying a power supply voltage or ground interconnections for supplying a ground voltage. The interconnection 251 is electrically connected to the electrode 111-2 of the semiconductor chip 110 via a bonding wire 241, and also electrically connected to one terminal of the capacitor 231. The interconnection 252 is electrically connected to the electrode 121-2 of the semiconductor chip 120 via a bonding wire 242, and also electrically connected to one terminal of the capacitor 232. When the power supply interconnections or ground interconnections are arranged between the signal interconnections 240 and 243, the influence of crosstalk between the signal interconnections 240 and 243 can be reduced. It is therefore possible to improve the communication quality between the semiconductor chip 110 and the semiconductor chip 120.

As described above, in the semiconductor device 200 according to the second embodiment, the capacitors 231 and 232 are respectively arranged under the bonding wires 240 and 243 that connect the semiconductor chips 110 and 120, thereby implementing a small packaging volume and a high degree of integration. In addition, the power supply interconnections or ground interconnections 251 and 252 are arranged between the signal interconnections 240 and 243, thereby reducing the influence of crosstalk between the signal interconnections 240 and 243. It is therefore possible to improve the communication quality between the semiconductor chip 110 and the semiconductor chip 120.

Third Embodiment

FIG. 3 is a plan view schematically showing a semiconductor device 300 according to the third embodiment. The same reference numerals as in FIG. 1A denote the same parts and portions in FIG. 3, and a description thereof will be omitted. The third embodiment is different from the second embodiment in that communication between semiconductor chips 110 and 120 is performed by differential transmission.

The semiconductor device 300 shown in FIG. 3 includes a substrate 101, the semiconductor chip 110 including an electrode group 111, the semiconductor chip 120 including an electrode group 121, and capacitors 331 and 332 corresponding to the discrete element part. The semiconductor chips 110 and 120 and the capacitors 331 and 332 are arranged at different positions on a major surface 102 of the substrate 101. The capacitors 331 and 332 are located between the semiconductor chip 110 and the semiconductor chip 120. Each of the capacitors 331 and 332 is, for example, a decoupling capacitor configured to reduce the fluctuation (noise) of the potential difference between the ground and the power supply of the semiconductor chip.

The electrode group 111 of the semiconductor chip 110 includes electrodes 111-1, 111-2, 111-3, 111-4, and 111-5. The electrodes 111-1 to 111-5 are arranged in this order and provided on the surface of the semiconductor chip 110 at a portion facing the semiconductor chip 120. The electrode group 121 of the semiconductor chip 120 includes electrodes 121-1, 121-2, 121-3, 121-4, and 121-5. The electrodes 121-1 to 121-5 are arranged in this order and provided on the surface of the semiconductor chip 120 at a portion facing the semiconductor chip 110. The electrodes 111-1 to 111-5 face the electrodes 121-1 to 121-5, respectively.

The electrode 111-1 and the electrode 121-1 are electrically connected by a bonding wire 340. The electrode 111-2 and the electrode 121-2 are electrically connected by a bonding wire 341. The pair of bonding wires 340 and 341 forms, for example, signal interconnections (differential transmission line) used by the semiconductor chip 120 to transmit a differential signal to the semiconductor chip 110. The capacitor 331 is arranged under the pair of bonding wires 340 and 341. The electrode 111-4 and the electrode 121-4 are electrically connected by a bonding wire 344. The electrode 111-5 and the electrode 121-5 are electrically connected by a bonding wire 345. The pair of bonding wires 344 and 345 forms, for example, signal interconnections used by the semiconductor chip 110 to transmit a differential signal to the semiconductor chip 120. The capacitor 332 is arranged under the pair of bonding wires 344 and 345. The capacitors 331 and 332 are arranged under the bonding wires 340, 341, 344, and 345, thereby implementing a high degree of integration.

Interconnections 351 and 352 are formed on the substrate 101. The interconnections 351 and 352 are power supply interconnections or ground interconnections for supplying a ground voltage. The interconnection 351 is electrically connected to the electrode 111-3 via a bonding wire 342, and also electrically connected to one terminal of the capacitor 331. The interconnection 352 is electrically connected to the electrode 121-3 via a bonding wire 343, and also electrically connected to one terminal of the capacitor 332. When the power supply interconnections or ground interconnections are arranged between the pair of signal interconnections 340 and 341 and the pair of signal interconnections 344 and 345, and communication between the semiconductor chips 110 and 120 is performed by differential transmission, the influence of crosstalk between the pair of signal interconnections 340 and 341 and the pair of signal interconnections 344 and 345 can further be reduced. It is therefore possible to further improve the communication quality between the semiconductor chip 110 and the semiconductor chip 120.

As described above, in the semiconductor device 300 according to the third embodiment, the capacitors 331 and 332 are arranged under the bonding wires 340, 341, 344, and 345 that connect the semiconductor chips 110 and 120, thereby implementing a small packaging volume and a high degree of integration. In addition, the power supply interconnections or ground interconnections 351 and 352 are arranged between the pair of signal interconnections 340 and 341 and the pair of signal interconnections 344 and 345, and communication between the semiconductor chips 110 and 120 is performed by differential transmission, thereby further reducing the influence of crosstalk between the pair of signal interconnections 340 and 341 and the pair of signal interconnections 344 and 345. It is therefore possible to further improve the communication quality between the semiconductor chip 110 and the semiconductor chip 120.

Fourth Embodiment

The fourth embodiment corresponds to a modification of the third embodiment.

Figure 4:
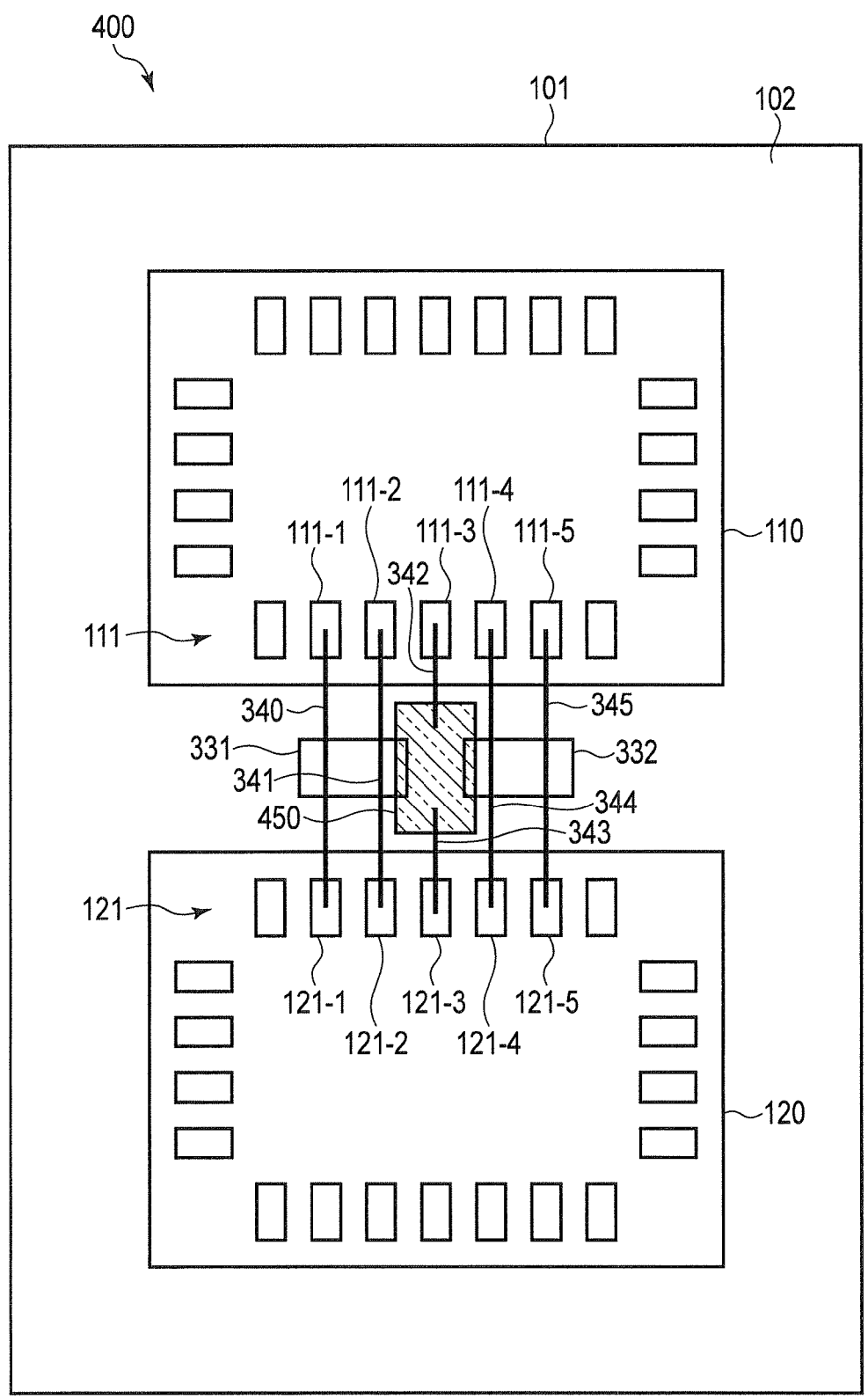
FIG. 4 is a plan view schematically showing a semiconductor device according to the fourth embodiment.

FIG. 4 is a plan view schematically showing a semiconductor device 400 according to the fourth embodiment. The same reference numerals as in FIG. 3 denote the same parts and portions in FIG. 4, and a description thereof will be omitted.

In the semiconductor device 400 shown in FIG. 4, a common interconnection 450 is formed on a substrate 101. The common interconnection 450 is a common power supply interconnection or common ground interconnection. The common interconnection 450 is electrically connected to an electrode 111-3 of a semiconductor chip 110 via a bonding wire 342 and to an electrode 121-3 of a semiconductor chip 120 via a bonding wire 343. That is, the fourth embodiment corresponds to a form in which the interconnections 351 and 352 (FIG. 3) described in the third embodiment are connected to or incorporated in the common interconnection 450.

When the common interconnection 450 is a common ground interconnection, the ground interconnections 351 and 352 shown in FIG. 3 are connected to the common ground interconnection 450. That is, both the electrode 111-3 of the semiconductor chip 110 and the electrode 121-3 of the semiconductor chip 120 are connected to the common ground interconnection 450. When the semiconductor chips 110 and 120 share the ground interconnection, the ground interconnection can be made wide. Hence, the impedance of the ground interconnection can be lowered. This makes it possible to improve the noise resistance ability of the ground.

When the common interconnection 450 is a common power supply interconnection, the power supply interconnections 351 and 352 shown in FIG. 3 are connected to the common power supply interconnection 450. That is, both the electrode 111-3 of the semiconductor chip 110 and the electrode 121-3 of the semiconductor chip 120 are connected to the common power supply interconnection 450. When the semiconductor chips 110 and 120 share the power supply interconnection, the power supply interconnection can be made wide. Hence, the impedance of the power supply interconnection can be lowered. This makes it possible to improve the noise resistance ability of the power supply.

As described above, in the semiconductor device 400 according to the present embodiment, the semiconductor chips 110 and 120 share the ground interconnection or power supply interconnection. It is therefore possible to make the interconnection region on the substrate 101 wide and improve the noise resistance ability of the ground or power supply while increasing the degree of integration.

Note that although the present embodiment has been explained as a modification of the third embodiment, the same modification can be made in other embodiments as well. For example, in the semiconductor device 200 (FIG. 2) according to the second embodiment, the ground interconnections (or power supply interconnections) 251 and 252 may be connected to the common ground interconnection (or common power supply interconnection).

Fifth Embodiment

FIG. 5 is a plan view schematically showing a semiconductor device 500 according to the fifth embodiment. The same reference numerals as in FIG. 1A denote the same parts and portions in FIG. 5, and a description thereof will be omitted.

The semiconductor device 500 shown in FIG. 5 comprises a substrate 101, a semiconductor chip 110 including an electrode group 111, a semiconductor chip 120 including an electrode group 121, and capacitors 531 and 532 corresponding to the discrete element part. The semiconductor chips 110 and 120 and the capacitors 531 and 532 are arranged at different positions on a major surface 102 of the substrate 101. The capacitors 531 and 532 are located between the semiconductor chip 110 and the semiconductor chip 120. Each of the capacitors 531 and 532 is, for example, a decoupling capacitor configured to reduce the fluctuation (noise) of the potential difference between the ground and the power supply of the semiconductor chip.

The electrode group 111 of the semiconductor chip 110 includes electrodes 111-1 to 111-7. The electrodes 111-1 to 111-7 are arranged in this order and provided on the surface of the semiconductor chip 110 at a portion facing the semiconductor chip 120. The electrode group 121 of the semiconductor chip 120 includes electrodes 121-1 to 121-7. The electrodes 121-1 to 121-7 are arranged in this order and provided on the surface of the semiconductor chip 120 at a portion facing the semiconductor chip 110. The electrodes 111-1 to 111-7 face the electrodes 121-1 to 121-7, respectively.

The electrode 111-2 and the electrode 121-2 are electrically connected by a bonding wire 542. The electrode 111-3 and the electrode 121-3 are electrically connected by a bonding wire 543. The pair of bonding wires 542 and 543 forms, for example, signal interconnections used by the semiconductor chip 120 to transmit a differential signal to the semiconductor chip 110. The capacitor 531 is arranged under the pair of bonding wires 542 and 543. The electrode 111-5 and the electrode 121-5 are electrically connected by a bonding wire 546. The electrode 111-6 and the electrode 121-6 are electrically connected by a bonding wire 547. The pair of bonding wires 546 and 547 forms, for example, a transmission line used by the semiconductor chip 110 to transmit a differential signal to the semiconductor chip 120. The capacitor 532 is arranged under the pair of bonding wires 546 and 547. The capacitors 531 and 532 are arranged under the bonding wires 542, 543, 546, and 547, thereby implementing a high degree of integration.

Ground interconnections 551, 552, 555, and 556 and power supply interconnections 553 and 554 are formed on the substrate 101. The ground interconnection 551 is electrically connected to the electrode 111-1 via a bonding wire 540, and also electrically connected to one terminal of the capacitor 531. The power supply interconnection 553 is electrically connected to the electrode 111-4 via a bonding wire 544, and also electrically connected to the other terminal of the capacitor 531. The ground interconnection 555 is electrically connected to the electrode 111-7 via a bonding wire 548.

The ground interconnection 552 is electrically connected to the electrode 121-1 via a bonding wire 541. The power supply interconnection 554 is electrically connected to the electrode 121-4 via a bonding wire 545, and also electrically connected to one terminal of the capacitor 532. The ground interconnection 556 is electrically connected to the electrode 121-7 via a bonding wire 549, and also electrically connected to the other terminal of the capacitor 532.

In the present embodiment, the pair of signal interconnections 542 and 543 is disposed between the ground interconnections 551 and 552 and the power supply interconnections 553 and 554. More specifically, the power supply interconnections 553 and 554 are provided inside the pair of signal interconnections 542 and 543 (on the side of the center), and the ground interconnections 551 and 552 are provided outside the pair of signal interconnections 542 and 543. When the ground interconnections 551 and 552 are provided outside the pair of signal interconnections 542 and 543, noise given by an external signal to the signal interconnections 542 and 543 can be reduced, and additionally, noise (EMI: Electro-Magnetic Interference) generated by the signal interconnections 542 and 543 can be reduced.

Similarly, the pair of signal interconnections 546 and 547 is disposed between the power supply interconnections 553 and 554 and the ground interconnections 555 and 556. More specifically, the power supply interconnections 553 and 554 are provided inside the pair of signal interconnections 546 and 547, and the ground interconnections 555 and 556 are provided outside the pair of signal interconnections 546 and 547. When the ground interconnections 555 and 556 are provided outside the pair of signal interconnections 546 and 547, noise given by an external signal to the signal interconnections 546 and 547 can be reduced, and additionally, noise (EMI) generated by the signal interconnections 546 and 547 can be reduced.

In addition, when the power supply interconnections 553 and 554 are arranged between the pair of signal interconnections 542 and 543 and the pair of signal interconnections 546 and 547, and communication between the semiconductor chips 110 and 120 is performed by differential transmission, the influence of crosstalk between the pair of signal interconnections 542 and 543 and the pair of signal interconnections 546 and 547 can be reduced. It is therefore possible to improve the communication quality between the semiconductor chip 110 and the semiconductor chip 120.

As described above, the semiconductor device 500 according to the fifth embodiment has the same advantages as in the third embodiment. In addition, the ground interconnections 551, 552, 555, and 556 are provided outside the signal interconnections 542, 543, 546, and 547. This makes it possible to reduce noise given by an external signal to the signal interconnections 542, 543, 546, and 547 and also reduce noise generated by the signal interconnections 542, 543, 546, and 547.

A modification of the fifth embodiment will be described next with reference to FIGS. 6 and 7.

Figure 6:
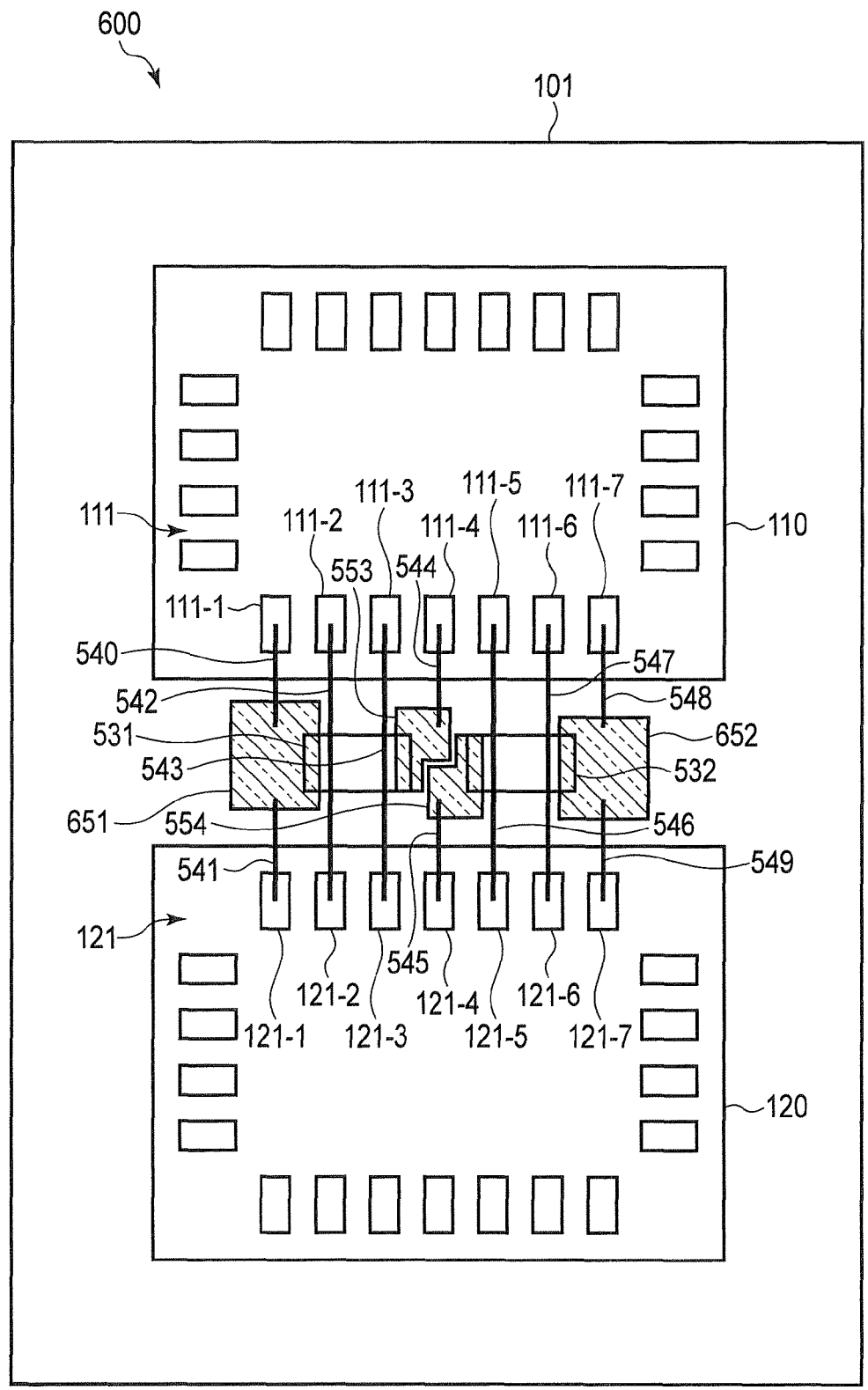
FIG. 6 is a plan view schematically showing a semiconductor device according to a modification of the fifth embodiment.

FIG. 6 is a plan view schematically showing a semiconductor device 600 according to a modification of the fifth embodiment. The same reference numerals as in FIG. 5 denote the same parts and portions in FIG. 6, and a description thereof will be omitted.

In the semiconductor device 600 shown in FIG. 6, the electrode 111-1 of the semiconductor chip 110 is electrically connected to a common ground interconnection 651 via the bonding wire 540, and the electrode 121-1 of the semiconductor chip 120 is electrically connected to the common ground interconnection 651 via the bonding wire 541. That is, the ground interconnections 551 and 552 shown in FIG. 5 are connected to or incorporated in the common ground interconnection 651. In addition, the electrode 111-7 of the semiconductor chip 110 is electrically connected to a common ground interconnection 652 via the bonding wire 548, and the electrode 121-7 of the semiconductor chip 120 is electrically connected to the common ground interconnection 652 via the bonding wire 549. That is, the ground interconnections 555 and 556 shown in FIG. 5 are connected to or incorporated in the common ground interconnection 652.

When the semiconductor chips 110 and 120 share the ground interconnection, the ground interconnection can be made wide. Hence, the impedance of the ground interconnection can be lowered. This makes it possible to improve the noise resistance ability of the ground.

FIG. 7 is a view showing examples of connection between the electrodes 111-1, 111-4, 111-7, 121-1, 121-4, and 121-7 and the interconnections on the substrate 101 shown in FIG. 5. Example 1 shown in FIG. 7 corresponds to the semiconductor device 500 described with reference to FIG. 5. Example 2 corresponds to the semiconductor device 500 shown in FIG. 5 in which the ground interconnections 551, 552, 555, and 556 are changed to power supply interconnections, and the power supply interconnections 553 and 554 are changed to ground interconnections. The power supply interconnections or ground interconnections may be allocated to the electrodes 111-1, 111-4, 111-7, 121-1, 121-4, and 121-7 as in examples 1 and 2.

Example 3 corresponds to the semiconductor device 600 described with reference to FIG. 6. Some interconnections may be replaced with a common interconnection as in example 3. Example 4 corresponds to the semiconductor device 600 shown in FIG. 6 in which the electrodes 111-4 and 121-4 are connected to a common power supply interconnection. Both the common ground interconnection and the common power supply interconnection may be provided as in example 4.

Note that FIG. 7 shows only several examples, and the embodiment may be practiced by another combination. The communication quality between the semiconductor chip 110 and the semiconductor chip 120 can be improved even when one of the combinations shown in FIG. 7 or another combination is applied.

Sixth Embodiment

In the sixth embodiment, an example will be described in which one of the two semiconductor chips is a wireless chip having a wireless communication function.

Figure 8:
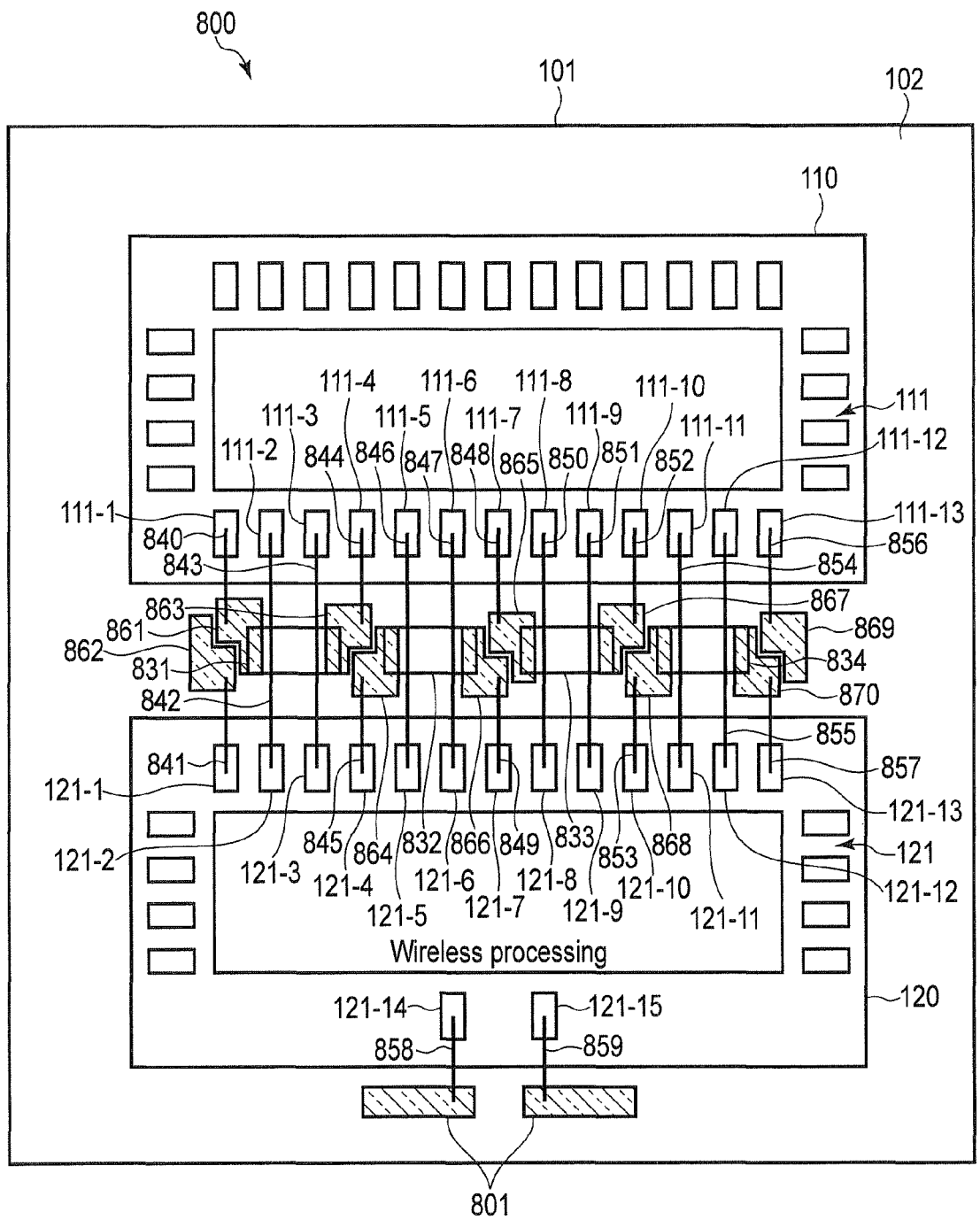
FIG. 8 is a plan view schematically showing a semiconductor device according to the sixth embodiment.

FIG. 8 is a plan view schematically showing a semiconductor device 800 according to the sixth embodiment. The same reference numerals as in FIG. 1A denote the same parts and portions in FIG. 8, and a description thereof will be omitted.

The semiconductor device 800 shown in FIG. 8 includes a substrate 101, a semiconductor chip 110 including an electrode group 111, a semiconductor chip 120 including an electrode group 121, and capacitors 831, 832, 833, and 834. The semiconductor chips 110 and 120 and the capacitors 831, 832, 833, and 834 are arranged at different positions on a major surface 102 of the substrate 101. The capacitors 831, 832, 833, and 834 are located between the semiconductor chip 110 and the semiconductor chip 120. Each of the capacitors 831, 832, 833, and 834 is, for example, a decoupling capacitor configured to reduce the fluctuation (noise) of the potential difference between the ground and the power supply of the semiconductor chip.

The semiconductor chip 120 according to the present embodiment has a wireless communication function. More specifically, the semiconductor chip 120 incorporates a transmission/reception circuit configured to transmit and receive a signal via an antenna (a dipole antenna in the example shown in FIG. 8) 801 formed on the substrate 101. For example, the transmission/reception circuit includes a quadrature demodulator and a quadrature modulator. The quadrature demodulator performs quadrature demodulation for a signal received by the dipole antenna 801 and generates an Ich (In-phase channel) signal and a Qch (Quadrature channel) signal. The Ich signal and the Qch signal are given to the semiconductor chip 110. The quadrature modulator performs quadrature modulation for an Ich signal and a Qch signal generated by the semiconductor chip 110 and generates a modulated signal. The modulated signal is transmitted via the dipole antenna 801.

Note that the transmission/reception circuit is merely an example, and the semiconductor chip 120 is not limited to this example. The semiconductor chip 120 need not always include the transmission/reception circuit and may include only a transmission circuit or only a reception circuit.

The electrode group 111 of the semiconductor chip 110 includes electrodes 111-1 to 111-13. The electrodes 111-1 to 111-13 are arranged in this order and provided on the surface of the semiconductor chip 110 at a portion facing the semiconductor chip 120. The electrode group 121 of the semiconductor chip 120 includes electrodes 121-1 to 121-13, 121-14, and 121-15. The electrodes 121-1 to 121-13 are arranged in this order and provided on the surface of the semiconductor chip 120 at a portion facing the semiconductor chip 110. The electrodes 121-14 and 121-15 are provided on the surface of the semiconductor chip 120 at another portion. The electrodes 111-1 to 111-13 face the electrodes 121-1 to 121-13, respectively. The electrode 121-14 and 121-15 are electrically connected to the dipole antenna 801 via bonding wires 858 and 859, respectively.

Note that the antenna 801 is not limited to the dipole antenna as shown in FIG. 8, and can be of another type such as a loop antenna, an inverted F antenna, a patch antenna, a Yagi antenna, or a slot antenna. The antenna 801 need not always be formed on the substrate 101, and may be formed on the semiconductor chip 120 or formed from a bonding wire, or use a combination thereof. The antenna 801 need not always be connected to the semiconductor chip 120 via the bonding wires 858 and 859 as shown in FIG. 8, and may be connected to the semiconductor chip 120 via bumps or interconnections on the substrate 101. The antenna 801 may be an external antenna connected to the substrate 101 by a connector.

The electrode 111-2 and the electrode 121-2 are electrically connected by a bonding wire 842. The electrode 111-3 and the electrode 121-3 are electrically connected by a bonding wire 843. The pair of bonding wires 842 and 843 forms, for example, signal interconnections used by the semiconductor chip 120 to transmit a differential signal based on the Ich signal to the semiconductor chip 110. The capacitor 831 is arranged under the pair of bonding wires 842 and 843. The electrode 111-5 and the electrode 121-5 are electrically connected by a bonding wire 846. The electrode 111-6 and the electrode 121-6 are electrically connected by a bonding wire 847. The pair of bonding wires 846 and 847 forms, for example, signal interconnections used by the semiconductor chip 120 to transmit a differential signal based on the Qch signal to the semiconductor chip 110. The capacitor 832 is arranged under the pair of bonding wires 846 and 847.

The electrode 111-8 and the electrode 121-8 are electrically connected by a bonding wire 850. The electrode 111-9 and the electrode 121-9 are electrically connected by a bonding wire 851. The pair of bonding wires 850 and 851 forms, for example, signal interconnections used by the semiconductor chip 110 to transmit a differential signal based on the Ich signal to the semiconductor chip 120. The capacitor 833 is arranged under the pair of bonding wires 850 and 851. The electrode 111-11 and the electrode 121-11 are electrically connected by a bonding wire 854. The electrode 111-12 and the electrode 121-12 are electrically connected by a bonding wire 855. The pair of bonding wires 854 and 855 forms, for example, signal interconnections used by the semiconductor chip 110 to transmit a differential signal based on the Qch signal to the semiconductor chip 120. The capacitor 834 is arranged under the pair of bonding wires 854 and 855.

The capacitors 831, 832, 833, and 834 are arranged under the signal interconnections 842, 843, 846, 847, 850, 851, 854, and 855, thereby implementing a high degree of integration.

Ground interconnections 861, 862, 865, 866, 869, and 870 and power supply interconnections 863, 864, 867, and 868 are formed on the substrate 101. The ground interconnection 861 is electrically connected to the electrode 111-1 via a bonding wire 840, and also electrically connected to one terminal of the capacitor 831. The power supply interconnection 863 is electrically connected to the electrode 111-4 via a bonding wire 844, and also electrically connected to the other terminal of the capacitor 831. The ground interconnection 865 is electrically connected to the electrode 111-7 via a bonding wire 848, and also electrically connected one terminal of the capacitor 833. The power supply interconnection 867 is electrically connected to the electrode 111-10 via a bonding wire 852, and also electrically connected the other terminal of the capacitor 833. The ground interconnection 869 is electrically connected to the electrode 111-13 via a bonding wire 856.

The ground interconnection 862 is electrically connected to the electrode 121-1 via a bonding wire 841. The power supply interconnection 864 is electrically connected to the electrode 121-4 via a bonding wire 845, and also electrically connected to one terminal of the capacitor 832. The ground interconnection 866 is electrically connected to the electrode 121-7 via a bonding wire 849, and also electrically connected the other terminal of the capacitor 832. The power supply interconnection 868 is electrically connected to the electrode 121-10 via a bonding wire 853, and also electrically connected to one terminal of the capacitor 834. The ground interconnection 870 is electrically connected to the electrode 121-13 via a bonding wire 857, and also electrically connected to the other terminal of the capacitor 834.

The interconnection structure described above can improve the communication quality between the semiconductor chip 110 and the semiconductor chip 120, as in the fifth embodiment.

As described above, in the semiconductor device 800 according to the sixth embodiment, the antenna 801 is connected to the semiconductor chip 120 having the wireless communication function. The semiconductor device 800 thus functions as a wireless unit with an antenna.

A modification of the sixth embodiment will be described next with reference to FIG. 9.

Figure 9:
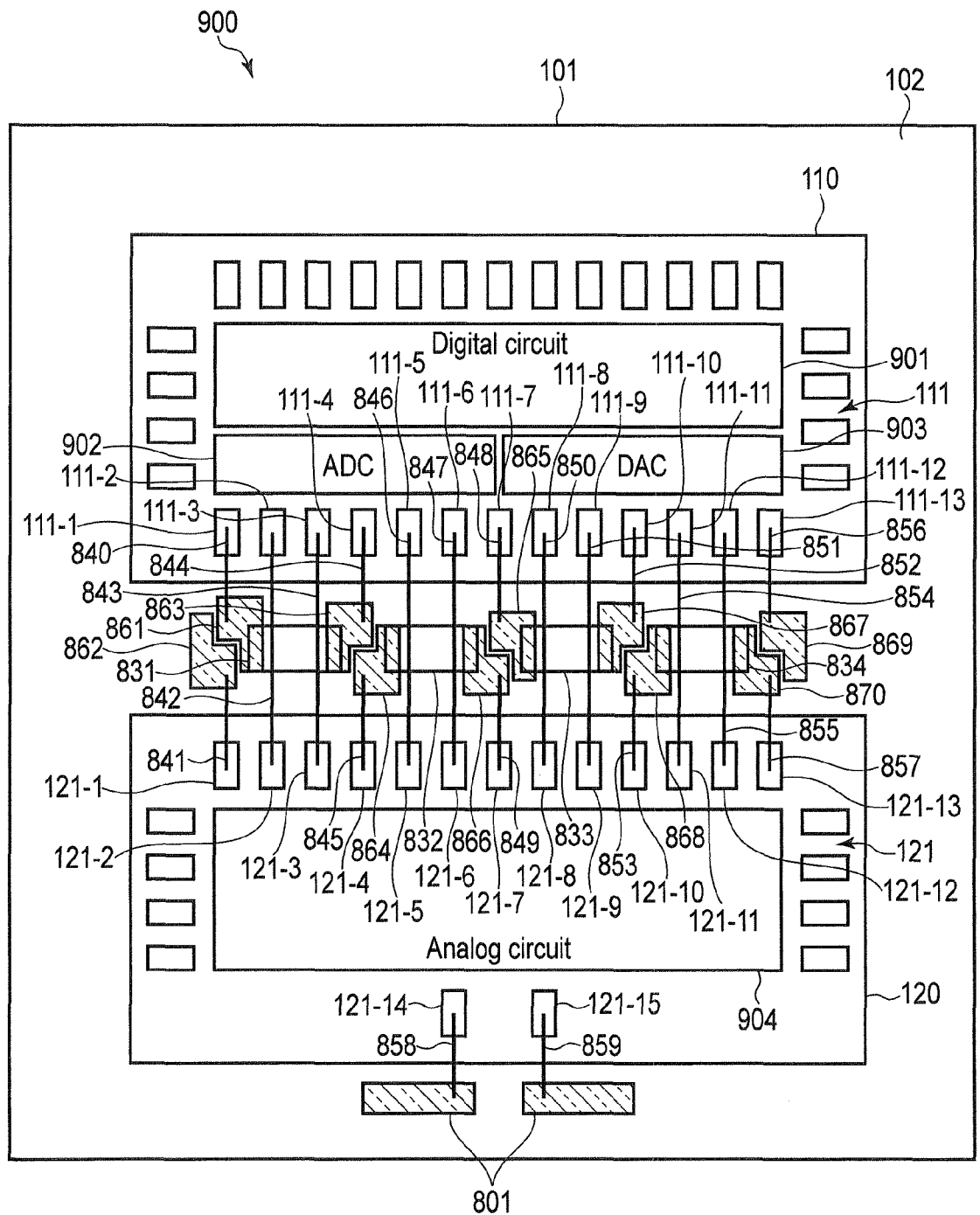
FIG. 9 is a plan view schematically showing a semiconductor device according to a modification of the sixth embodiment.

FIG. 9 is a plan view schematically showing a semiconductor device 900 according to a modification of the sixth embodiment. The same reference numerals as in FIG. 8 denote the same parts and portions in FIG. 9, and a description thereof will be omitted.

In the semiconductor device 900 shown in FIG. 9, the semiconductor chip 110 includes a digital signal processing circuit (to be also simply referred to as a digital circuit) 901, an analog-to-digital converter circuit (ADC) 902, and a digital-to-analog converter circuit (DAC) 903. The semiconductor chip 120 includes an analog signal processing circuit (to be also simply referred to as an analog circuit) 904. The dipole antenna 801 is connected to the semiconductor chip 120.

The analog circuit 904 of the semiconductor chip 120 demodulates a signal received by the antenna 801 to generate an analog signal. The analog signal is transmitted to the ADC 902 of the semiconductor chip 110 via the signal interconnections 842, 843, 846, and 847. The ADC 902 converts the received analog signal into a digital signal and gives it to the digital circuit 901.

The digital circuit 901 of the semiconductor chip 110 gives, to the DAC 903, data to be transmitted. The DAC 903 converts the data into an analog signal and transmits it to the analog circuit 904 of the semiconductor chip 120 via the signal interconnections 850, 851, 854, and 855. The analog circuit 904 modulates the received analog signal and transmits it via the antenna 801.

As described above, signal transmission/reception between the semiconductor chips 110 and 120 is executed via the bonding wires 842, 843, 846, 847, 850, 851, 854, and 855. In addition, power is supplied to the semiconductor chip 110 via the bonding wires 844 and 852, and power is supplied to the semiconductor chip 120 via the bonding wires 845 and 853.

In the modification of the present embodiment, the digital circuit 901 and the analog circuit 904 are separated to the two semiconductor chips 110 and 120. The semiconductor chip 110 including the digital circuit 901 is formed by using the process of an advanced micropatterning technology, thereby implementing a small area and low power consumption. If the semiconductor chip 120 including the analog circuit 904 is formed by using the process of the advanced micropatterning technology, it may be impossible to provide sufficient performance because of a decrease in the power supply voltage. The 2-chip structure makes it possible to form the semiconductor chip 120 formed by using a process different from that of the semiconductor chip 110 and improve the performance of the semiconductor chip 120.

Seventh Embodiment

In the seventh embodiment, an example will be described in which the two semiconductor chips are wireless chips having a wireless communication function.

FIG. 10 is a plan view schematically showing a semiconductor device 1000 according to the seventh embodiment. The same reference numerals as in FIG. 8 denote the same parts and portions in FIG. 10, and a description thereof will be omitted.

In the semiconductor device 1000 shown in FIG. 10, an electrode group 111 of a semiconductor chip 110 further includes an electrode 111-14. The electrode 111-14 is electrically connected, via a bonding wire 1040, to an antenna 1001 formed on a substrate 101. The antenna 1001 can be of any type such as a dipole antenna, a loop antenna, an inverted F antenna, a patch antenna, a Yagi antenna, or a slot antenna. The antenna 1001 need not always be formed on the substrate 101, and may be formed on the semiconductor chip 110 or formed from a bonding wire, or use a combination thereof. The antenna 1001 need not always be connected to the semiconductor chip 110 via the bonding wire 1040 as shown in FIG. 10, and may be connected to the semiconductor chip 110 via a bump or an interconnection on the substrate 101. The antenna 1001 may be an external antenna connected to the substrate 101 by a connector.

In the present embodiment, both the semiconductor chips 110 and 120 are wireless chips having a wireless communication function. For example, the semiconductor chip 110 is the chip of a wireless system (for example, IEEE802.11n) having a carrier frequency in the microwave band (for example, 2.4 GHz band), and the semiconductor chip 120 is the chip of a wireless system (for example, IEEE802.11ad) having a carrier frequency in the millimeter wave band (for example, 60 GHz band).

In general, the yield upon manufacturing the semiconductor chip of a wireless system handling a high frequency is lower than upon manufacturing the semiconductor chip of a wireless system handling a low frequency. For example, if a chip of high yield such as a microwave wireless chip and a chip of poor yield such as a millimeter wave wireless chip are separated, the yield can be improved.

In the sixth and seventh embodiments, examples have been described in which at least one of the semiconductor chips of the semiconductor devices shown in FIGS. 8, 9, and 10 is a chip having a wireless communication function. However, in the semiconductor devices shown in FIGS. 1A, 1B, 2, 3, 4, 5, and 6 as well, at least one of the semiconductor chips can be a chip having a wireless communication function.

Eighth Embodiment

In the eighth embodiment, a wireless device and a storage device each including one of the semiconductor devices described in the first to seventh embodiments will be explained. Each of the wireless device and the storage device according to the present embodiment uses, for example, a semiconductor device as a wireless unit. The wireless device is formed by mounting the above-described semiconductor device on a device for exchanging data, an image, or a moving image.

The wireless device according to the present embodiment will be described with reference to FIGS. 10 and 11.

A wireless device 1100 shown in FIG. 11 includes a semiconductor device 1101, a processor 1102, and a memory 1103.

The semiconductor device 1101 transmits/receives data to/from the outside. Note that the semiconductor device 1101 can be one of the semiconductor devices described above in the first to seventh embodiments.

The processor (to be also referred to as a controller) 1102 processes data received from the semiconductor device 1101 and data to be transmitted to the semiconductor device 1101.

The memory 1103 stores data. More specifically, the memory 1103 receives data from the processor 1102 and stores it. The memory 1103 provides data to the processor 1102.

An example of the wireless device including the semiconductor device 1101 will be described next with reference to FIG. 12.

In this case, for example, a notebook personal computer (PC) 1201 and a portable terminal 1202 are wireless devices. The notebook PC 1201 and the portable terminal 1202 include display units 1203 and 1204, respectively, so that the user can view a still image or a moving image. Each of the notebook PC 1201 and the portable terminal 1202 also includes a central processing unit (CPU) (to be also referred to as a controller), a memory, and the like. Each of the notebook PC 1201 and the portable terminal 1202 includes the semiconductor device 1101 inside or outside, and performs, for example, data communication via the semiconductor device 1101. The notebook PC 1201 and the portable terminal 1202 can include any of the above-described semiconductor devices.

When the wireless device included in the notebook PC 1201 and the wireless device included in the portable terminal 1202 are arranged such that their antennas face each other in the directions of high directivity, efficient data exchange can be performed.

In the example shown in FIG. 12, the notebook PC 1201 and the portable terminal 1202 are illustrated. However, the present invention is not limited to this, and the semiconductor device 1101 may be included in another device such as a TV, a digital camera, or a memory card.

A case in which the semiconductor device is included in a storage device will be described next with reference to FIG. 13. In the example shown in FIG. 13, a memory card 1300 is used as the storage device.

As shown in FIG. 13, the memory card 1300 includes the semiconductor device 1101 and a memory card main body 1301, and can wirelessly communicate with a notebook PC, a portable terminal, a digital camera, or the like via the semiconductor device 1101. The memory card main body 1301 includes a memory 1302 that stores information, and a controller 1303 that performs overall control of the device.

According to the above-described eighth embodiment, when the semiconductor device is included in a wireless device such as a notebook PC or portable terminal that performs wireless data communication, or a storage device, transmission/reception of data or the like can efficiently be performed. The semiconductor device described in each of the first to seventh embodiments has a small packaging volume and can therefore easily be packaged in a wireless device or a storage device.

According to at least one of the above-described embodiments, a discrete element part is arranged under the bonding wire that connects the semiconductor chips, thereby implementing a small packaging volume and a high degree of integration.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
a substrate;
a first semiconductor chip arranged on the substrate and comprising a first electrode group;
a second semiconductor chip arranged on the substrate and comprising a second electrode group, at least one of electrodes included in the second electrode group being connected to at least one of electrodes included in the first electrode group via at least one bonding wire; and
a discrete element part arranged on the substrate and under the at least one bonding wire,
wherein:
the discrete element part includes a first capacitor connected to one of a first power supply interconnection and a first ground interconnection, and a second capacitor connected to one of a second power supply interconnection and a second ground interconnection,
the at least one bonding wire includes a first bonding wire and a second bonding wire,
the first electrode group includes a first electrode, a second electrode, and a third electrode which are arranged on the first semiconductor chip in this order,
the first electrode is connected to an end of the first bonding wire,
the second electrode is connected to the one of the first power supply interconnection and the first ground interconnection,
the third electrode is connected to an end of the second bonding wire, the second electrode group includes a fourth electrode, a fifth electrode, and a sixth electrode which are arranged on the second semiconductor chip in this order, the fourth electrode is connected to another end of the first bonding wire, the fifth electrode is connected to the one of the second power supply interconnection and the second ground interconnection, the sixth electrode is connected to another end of the second bonding wire, and the first capacitor is arranged under the first bonding wire, and the second capacitor is arranged under the second bonding wire.

2. The device according to claim 1, wherein the first capacitor and the second electrode are connected to the first power supply interconnection, the second capacitor and the fifth electrode are connected to the second power supply interconnection, and the first power supply interconnection and the second power supply interconnection are connected to a common power supply interconnection formed on the substrate.

3. The device according to claim 1, wherein the first capacitor and the second electrode are connected to the first ground interconnection, the second capacitor and the fifth electrode are connected to the second ground interconnection, and the first ground interconnection and the second ground interconnection are connected to a common ground interconnection formed on the substrate.

4. The device according to claim 1, wherein the first electrode group further includes a seventh electrode and an eighth electrode, the seventh electrode, the first semiconductor chip, the first electrode, the second electrode, the third electrode, and the eighth electrode being arranged on the first semiconductor in this order, the seventh electrode is connected to one of a third power supply interconnection and a third ground interconnection, the eighth electrode is connected to one of a fourth power supply interconnection and a fourth ground interconnection, the second electrode group further includes a ninth electrode and a tenth electrode, the ninth electrode, the fourth electrode, the fifth electrode, the sixth electrode, and the tenth electrode being arranged on the first semiconductor chip in this order, the ninth electrode is connected to one of a fifth power supply interconnection and a fifth ground interconnection, and the tenth electrode is connected to one of a sixth power supply interconnection and a sixth ground interconnection.

5. A semiconductor device comprising:

a substrate;

a first semiconductor chip arranged on the substrate and comprising a first electrode group;

a second semiconductor chip arranged on the substrate and comprising a second electrode group, at least one of electrodes included in the second electrode group being connected to at least one of electrodes included in the first electrode group via at least one bonding wire; and a discrete element part arranged on the substrate and under the at least one bonding wire, wherein:

the discrete element part includes a first capacitor connected to one of a first power supply interconnection and a first ground interconnection, and a second capacitor connected to one of a second power supply interconnection and a second ground interconnection, the at least one bonding wire includes a first bonding wire and a second bonding wire which are configured to transmit a differential signal, and a third bonding wire and a fourth bonding wire which are configured to transmit a differential signal, the first electrode group includes a first electrode, a second electrode, a third electrode, a fourth electrode, and a fifth electrode which are arranged on the first semiconductor chip in this order, the first electrode is connected to an end of the first bonding wire, the second electrode is connected to an end of the second bonding wire, the third electrode is connected to the one of the first power supply interconnection and the first ground interconnection, the fourth electrode is connected to an end of the third bonding wire, the fifth electrode is connected to an end of the fourth bonding wire, the second electrode group includes a sixth electrode, a seventh electrode, an eighth electrode, a ninth electrode, and a tenth electrode which are arranged on the second semiconductor chip in this order, the sixth electrode is connected to another end of the first bonding wire, the seventh electrode is connected to another end of the second bonding wire, the eighth electrode is connected to the one of the second power supply interconnection and the second ground interconnection, the ninth electrode is connected to another end of the third bonding wire, the tenth electrode is connected to another end of the fourth bonding wire, and the first capacitor is arranged under the first bonding wire and the second bonding wire, and the second capacitor is arranged under the third bonding wire and the fourth bonding wire.

6. The device according to claim 5, wherein the first capacitor and the third electrode are connected to the first power supply interconnection, the second capacitor and the eighth electrode are connected to the second power supply interconnection, and the first power supply interconnection and the second power supply interconnection are connected to a common power supply interconnection formed on the substrate.

7. The device according to claim 5, wherein the first capacitor and the third electrode are connected to the first ground interconnection, the second capacitor and the eighth electrode are connected to the second ground interconnection, and the first ground interconnection and the second ground interconnection are connected to a common ground interconnection formed on the substrate.

8. The device according to claim 5, wherein the first electrode group further includes an eleventh electrode and a twelfth electrode, the eleventh electrode, the first electrode, the second electrode, the third electrode, the fourth electrode, the fifth electrode, and the twelfth electrode being arranged on the first semiconductor chip in this order, the eleventh electrode is connected to one of a third power supply interconnection and a third ground interconnection, the twelfth electrode is connected to one of a fourth power supply interconnection and a fourth ground interconnection, the second electrode group further includes a thirteenth electrode and a fourteenth electrode, the thirteenth electrode, the sixth electrode, the seventh electrode, the eighth electrode, the ninth electrode, the tenth electrode, and the fourteenth electrode being arranged on the second semiconductor chip in this order, the thirteenth electrode is connected to one of a fifth power supply interconnection and a fifth ground interconnection, and the fourteenth electrode is connected to one of a sixth power supply interconnection and a sixth ground interconnection.

9. The device according to claim 1, wherein at least one of the first semiconductor chip and the second semiconductor chip is a wireless chip having a wireless communication function.

10. The device according to claim 1, wherein
the first semiconductor chip is a wireless chip that performs communication in a microwave band, and
the second semiconductor chip is a wireless chip that performs communication in a millimeter wave band.

11. A wireless device comprising:
the semiconductor device according to claim 9;
a controller configured to process data to be exchanged with the semiconductor device; and
a memory configured to store the data.

12. A storage device comprising:
the semiconductor device according to claim 9;
a controller configured to process data to be exchanged with the semiconductor device; and
a memory configured to store the data.

13. A wireless device comprising:
the semiconductor device according to claim 10;
a controller configured to process data to be exchanged with the semiconductor device; and
a memory configured to store the data.

14. A storage device comprising:
the semiconductor device according to claim 10;
a controller configured to process data to be exchanged with the semiconductor device; and
a memory configured to store the data.

15. The device according to claim 5, wherein at least one of the first semiconductor chip and the second semiconductor chip is a wireless chip having a wireless communication function.

16. The device according to claim 5, wherein
the first semiconductor chip is a wireless chip that performs communication in a microwave band, and
the second semiconductor chip is a wireless chip that performs communication in a millimeter wave band.

17. A wireless device comprising:
the semiconductor device according to claim 15;
a controller configured to process data to be exchanged with the semiconductor device; and
a memory configured to store the data.

18. A storage device comprising:
the semiconductor device according to claim 15;
a controller configured to process data to be exchanged with the semiconductor device; and
a memory configured to store the data.

19. A wireless device comprising:
the semiconductor device according to claim 16;
a controller configured to process data to be exchanged with the semiconductor device; and
a memory configured to store the data.

20. A storage device comprising:
the semiconductor device according to claim 16;
a controller configured to process data to be exchanged with the semiconductor device; and
a memory configured to store the data.

\* \* \* \* \*